US009897910B2

(12) United States Patent
Hsu et al.

(10) Patent No.: US 9,897,910 B2
(45) Date of Patent: *Feb. 20, 2018

(54) TREATING A CAPPING LAYER OF A MASK

(71) Applicant: TAIWAN SEMICONDUCTOR MANUFACTURING COMPANY, LTD., Hsin-Chu (TW)

(72) Inventors: Pei-Cheng Hsu, Taipei (TW);
Chih-Cheng Lin, Kaohsiung (TW);
Ta-Cheng Lien, Hsinchu County (TW);
Wei-Shiuan Chen, Hsin-Chu (TW);
Hsin-Chang Lee, Zhubei (TW);
Anthony Yen, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/395,784

(22) Filed: Dec. 30, 2016

(65) Prior Publication Data
US 2017/0108768 A1    Apr. 20, 2017

Related U.S. Application Data

(63) Continuation of application No. 14/582,459, filed on Dec. 24, 2014, now Pat. No. 9,535,317.

(51) Int. Cl.
| *G03F 1/24* | (2012.01) |
| *G03F 1/26* | (2012.01) |
| *G03F 1/48* | (2012.01) |
| *H01L 21/033* | (2006.01) |
| *H01L 21/311* | (2006.01) |
| *H01L 21/3105* | (2006.01) |
| *G03F 1/80* | (2012.01) |

(52) U.S. Cl.
CPC ............ *G03F 1/24* (2013.01); *G03F 1/26* (2013.01); *G03F 1/48* (2013.01); *G03F 1/80* (2013.01); *H01L 21/0332* (2013.01); *H01L 21/0335* (2013.01); *H01L 21/0337* (2013.01); *H01L 21/3105* (2013.01); *H01L 21/31116* (2013.01)

(58) Field of Classification Search
CPC .............. G03F 1/24; G03F 1/26; G03F 1/48
USPC .......................................................... 430/5
See application file for complete search history.

(56) References Cited

U.S. PATENT DOCUMENTS

| 8,628,897 | B1 | 1/2014 | Lu et al. |
| 8,658,333 | B2 | 2/2014 | Chai et al. |
| 8,679,707 | B2 | 3/2014 | Lee et al. |
| 8,691,476 | B2 | 4/2014 | Yu et al. |
| 8,709,682 | B2 | 4/2014 | Chen et al. |
| 8,715,890 | B2 | 5/2014 | Tu et al. |
| 8,722,286 | B2 | 5/2014 | Yu et al. |
| 8,753,788 | B1 | 6/2014 | Yu et al. |
| 8,764,995 | B2 | 7/2014 | Chang et al. |
| 8,765,330 | B2 | 7/2014 | Shih et al. |
| 8,765,582 | B2 | 7/2014 | Hsu et al. |
| 8,785,084 | B2 | 7/2014 | Lu et al. |
| 8,828,625 | B2 | 9/2014 | Lu et al. |
| 8,841,047 | B2 | 9/2014 | Yu et al. |
| 8,850,366 | B2 | 9/2014 | Liu et al. |
| 8,877,409 | B2 | 11/2014 | Hsu et al. |
| 9,535,317 | B2 * | 1/2017 | Hsu .................... G03F 1/48 |

* cited by examiner

Primary Examiner — Christopher G Young
(74) Attorney, Agent, or Firm — Haynes and Boone, LLP

(57) ABSTRACT

A method for forming a lithography mask includes forming a capping layer on a reflective multilayer layer, the capping layer comprising a first material, forming a patterned patterning layer on the capping layer, and introducing a secondary material into the capping layer, the secondary material having an atomic number that is smaller than 15.

20 Claims, 5 Drawing Sheets

TREATING A CAPPING LAYER OF A MASK

PRIORITY INFORMATION

This application is a continuation of U.S. application Ser. No. 14/582,459 filed Dec. 24, 2014 and entitled "Treating a Capping Layer of a Mask," the disclosure of which is hereby incorporated by reference in its entirety.

BACKGROUND

When fabricating integrated circuits, photolithography is often used to form various features such as metal lines into a semiconductor substrate. To form these features, photomasks are used to form a pattern into a photo-resist layer. The regions where the photo-resist layer is removed expose the underlying substrate to an etching process used to form trenches where metal is subsequently placed.

One type of photolithography is Extreme Ultraviolet (EUV) lithography. In one example of an EUV mask, a patterned absorption layer is formed on a reflective multilayer. To expose a photoresist layer on a substrate, EUV light is projected onto the mask through a number of mirrors. The exposed portions of reflective layer then reflect light onto the substrate on which an integrated circuit is to be formed. The light thus exposes a photoresist layer deposited on that substrate.

An EUV mask typically includes a capping layer between the reflective layer and the absorption layer. The capping layer protects the reflective layer from various particles that accumulate on the mask during field operations. The capping layer, however, is subject to damage as well. For example, the EUV mask is generally cleaned after a certain number of uses. This cleaning process can cause damage to the capping layer over time. Additionally, the capping layer can be subject to oxidation, which also damages the capping layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
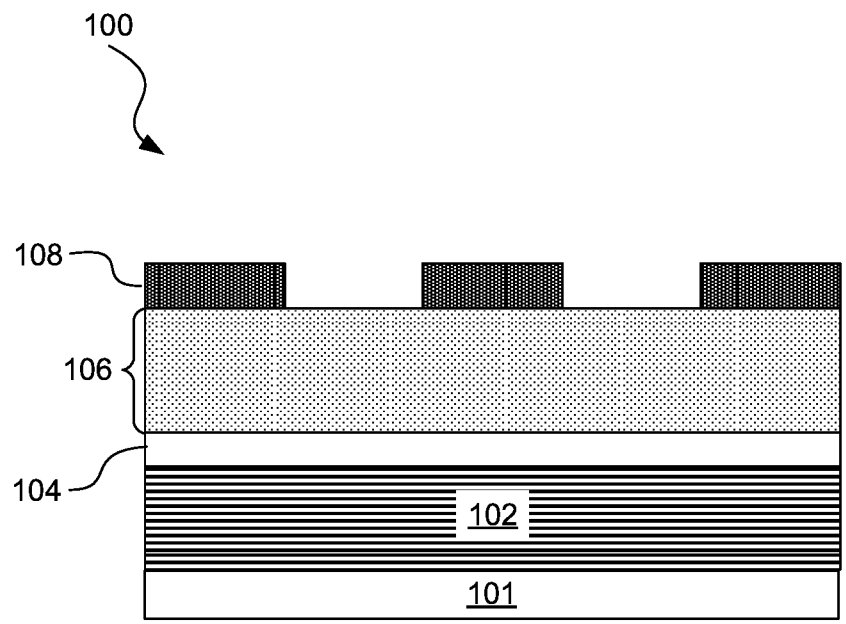
FIGS. 1A-1D are diagrams showing an illustrative process for treating a capping layer of a mask, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, the capping layer of a photolithography mask such as an EUV mask is subject to damage. According to principles described herein, the capping layer undergoes a treatment process to strengthen the capping layer so that it resists oxidation and is less prone to damage. Particularly, a secondary material is introduced into the capping layer to strengthen the capping layer. In one example, an implantation process is applied to the capping layer. The implantation process causes diffusion of a secondary material having a smaller atomic number than the material that forms the capping layer. In one example, the capping layer is made of ruthenium (Ru), which has an atomic number of 44. The ruthenium capping layer can be treated such that nitrogen is diffused into the capping layer. Nitrogen has an atomic number of 7. In some examples, any secondary material having an atomic number that is less than 15 is implanted into the capping layer. By doing so, the capping layer is stressed such that it is less prone to oxidation and other forms of damage.

Figure 1B:
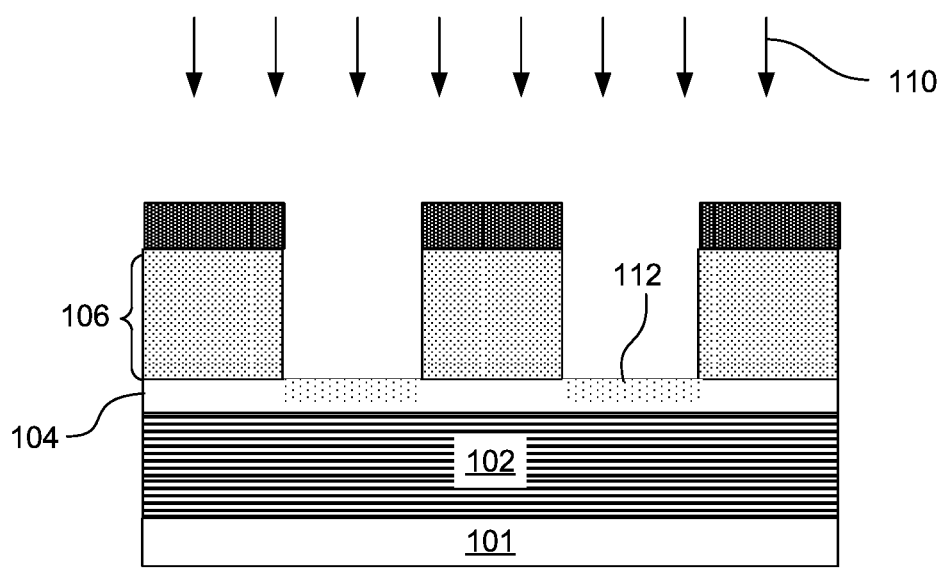

FIGS. 1A-1B are diagrams showing an illustrative process for fabricating a mask with a treated capping layer. According to the present example, the mask 100, at a particular point during fabrication of the mask 100, includes a substrate 101, a reflective multilayer 102, a capping layer 104, a patterning layer 106, and a photoresist layer 108.

In one example, the mask 100 is an EUV mask. EUV lithography utilizes a reflective mask rather than a transmissive mask. EUV lithography utilizes scanners that emit light in the extreme ultraviolet (EUV) region, which is light having a wavelength of about 1-100 nm. Some EUV scanners provide 4× reduction projection printing, similar to some optical scanners, except that the EUV scanners use reflective rather than refractive optics, i.e., mirrors instead of lenses. EUV scanners provide the desired pattern on an absorption layer ("EUV" mask absorber) formed on a reflective mask. EUV lithography is similar to optical lithography in that it needs a mask to print wafers, except that it employs light in the EUV region, i.e., at 13.5 nm. At the wavelength of 13.5 nm or so, all materials are highly absorbing. Thus, reflective optics rather than refractive optics are used.

The substrate 101 is made of a suitable material, such as a Low Thermal Expansion Material (LTEM) or fused quartz.

In various examples, the LTEM includes TiO$_2$ doped SiO$_2$, or other suitable materials with low thermal expansion. In some examples, a conductive layer is additionally disposed under on the backside of the LTEM substrate 101 for the electrostatic chucking purpose. In one example, the conductive layer includes chromium nitride (CrN), though other suitable compositions are possible.

The mask 100 also includes a reflective multilayer 102 deposited on the substrate 101. The reflective multilayer 102 includes a plurality of film pairs, such as molybdenum-silicon (Mo/Si) film pairs (e.g., a layer of molybdenum above or below a layer of silicon in each film pair). Alternatively, the reflective multilayer 102 may include molybdenum-beryllium (Mo/Be) film pairs, or other suitable materials that are configurable to highly reflect the EUV light. The characteristics of the reflective multilayer 102 are selected such that it provides a high reflectivity to specific electromagnetic radiation type/wavelength. Specifically, for the purpose of EUV lithography, the reflective multilayer 102 is designed to reflect light within the EUV range. The thickness of each layer of the reflective multilayer 102 depends on the EUV wavelength and the incident angle. Particularly, the thickness of the reflective multilayer 102 (and the thicknesses of the film pairs) is adjusted to achieve a maximum constructive interference of the EUV light diffracted at each interface and a minimum absorption of the EUV light.

The mask 100 further includes a capping layer 104 on the reflective multilayer 102. The capping layer 104 is designed to be transparent to EUV light and to protect the reflective multilayer 102 from damage and/or oxidation. In one example, the capping layer is made of ruthenium. The ruthenium capping layer can be formed as a crystal structure. The thickness of the capping layer may be within a range of about 2 to 7 nanometers.

The mask 100 also includes a patterning layer 106. In FIG. 1A, the patterning layer 106 has not yet been patterned. The patterning layer 106 is used to form the desired exposure pattern 106 onto the mask. The patterning layer 106 may serve this purpose in a variety of ways. In one embodiment, the patterning layer 106 is an absorption material. In another embodiment, the patterning layer 106 is a phase shifting material, which is similar to the reflective multilayer 102 material.

In the case where the patterning layer 106 is an absorption material, the EUV mask 100 can be referred to as a Binary Intensity Mask (BIM). With a BIM, the remaining portions after the patterning layer 106 has been patterned are light absorbing, or opaque, regions. In the opaque regions, an absorber is present, and an incident light is almost fully absorbed by the absorber. In the reflective regions, the absorber is removed and the incident light is reflected by the underlying reflective multilayer 102. In some examples, the absorption material is chromium or other suitable absorption material.

In the case where the patterning layer 106 is a second reflective multilayer, the EUV mask can be referred to as a Phase Shifting Mask (PSM). With a PSM, the patterning layer 106 is a second reflective layer patterned with the integrated circuit design. The second reflective layer is designed so as to cause a phase difference (such as 180° phase difference) between the light reflected from the reflective multilayer 106 and the light reflected from the reflective multilayer 102. The phase shifting mask may be an alternating phase shifting mask or an attenuated phase shifting mask. In some examples, the second reflective multilayer may be similar to the first reflective multilayer, such as alternating Mo/Si films.

The photoresist layer 108 is used to pattern the patterning layer 108 with the integrated circuit design. Conventional methods for patterning the photoresist 108 may be used in accordance with principles described herein. Because, the mirrors used in the EUV lithography process may shrink the pattern, the patterning layer 106 may be patterned using such conventional techniques. In some examples, e-beam or laser writing may be used to pattern the patterning layer 106.

FIG. 1B is a diagram showing an illustrative etching process 110 used to pattern the patterning layer. The etching process 100 is an anisotropic etching process. Thus, the etching occurs primarily in one direction. The etching process 110 may be, for example, a dry etching process. During the etching process 110, the portions of the patterning layer 106 that are not protected by the patterned photoresist 108 layer are removed. Dry etching removes material by exposing the material to a bombardment of ions. The dry etch process utilizes a plasma of reactive gases such as fluorocarbons, oxygen, chlorine, boron trichloride and other gases. The bombardment of ions dislodges portions of the exposed surface.

According to principles described herein, the dry etching process 110 can be modified so that during the dry etching process, the capping layer 104 is treated. According to one example of principles described herein, the etching process is modified to cause introduction of the secondary material into the capping layer in addition to removing the exposed portions of the patterning layer 106. The secondary material that is introduced into the capping layer 104 has an atomic number that is less than the atomic number of the main material that forms the capping layer. In some examples, the secondary material is selected from the elements having an atomic number less than 15. For example, the secondary material may be carbon, nitrogen, or phosphorous. The secondary material may be introduced to the capping layer 104 through one of a variety of methods. In one example, the secondary material is introduced into the capping layer 104 during the same process used to etch away the patterning layer.

In the example where the secondary material is introduced into the capping layer in the same process of etching the patterning layer 106, the gases used during the dry etching process 110 is selected accordingly. For example, the secondary material may be nitrogen, which has an atomic number of 7. In such a case, the dry etching process can utilize an etching gas that includes chlorine and a carrier gas that includes nitrogen. Thus, after the exposed portions of the patterning layer 106 are moved, the nitrogen within the carrier gas is introduced into the surface of the capping layer 104 to create strengthened portions 112 of the capping layer 104. As will be described in further detail below, the strengthened portions 112 are less susceptible to oxidation.

Figure 1C:
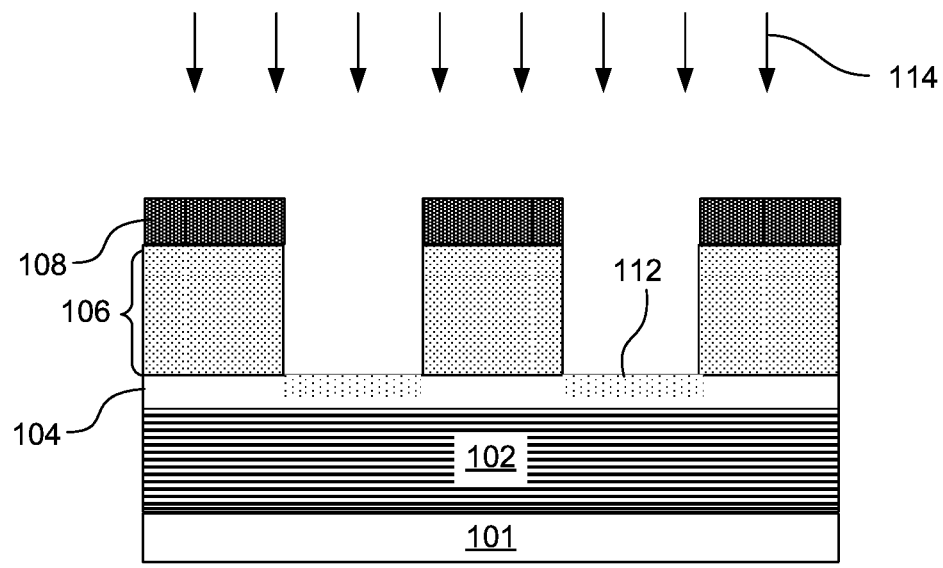

FIG. 1C illustrates another example in which the secondary material is introduced in a separate implanting process 114 after the patterning layer 106 has been patterned. Specifically, the dry etching process 110 may be a conventional dry etching process. Such processes may involve an etching gas that includes chlorine and a carrier gas that includes argon. Then, after the dry etching process 110 has completed and the capping layer 104 is exposed, nitrogen can be introduced by an ion implantation process using an implanting step 114. The implanting step 114 involves the use of nitrogen plasma. This implantation process 114 can be performed in the same chamber that the dry etching process 110 is performed.

The introduction of the secondary material can be designed to introduce the secondary material in a manner such that the secondary material does not exceed a predetermined depth. In one example, the predetermined depth is based on a diffusion region between the capping layer 104 and the multilayer 102. When the capping layer 104 is formed on the multilayer, there is a diffusion region between the capping layer 104 and the multilayer where materials from one layer diffuse into the other material. The secondary material of the capping layer 104 can be implanted such that it does not extend to the diffusion region between the capping layer 104 and the multilayer 102.

The introduction process, whether done separate or with the dry etching process, can be performed at room temperature. By avoiding high temperatures, there is less change of inter-diffusion of the reflective multilayer 102. Thus, the capping layer 103 can be effectively treated without damaging the reflective multilayer 102.

In some examples, there may be other materials within the capping layer besides the main capping layer material and the secondary material. For example, in the case where the capping layer primarily includes ruthenium, and the secondary material is nitrogen, the capping layer may have various other elements such as carbon, oxygen, silicon, silicon oxide, and molybdenum. Such materials, however, may be in smaller concentrations compared to the ruthenium and the secondary material.

The secondary material in the capping layer 104 has a concentration higher enough to effectively strengthen the capping layer 104. In some examples, the secondary material can be introduced such that it has a concentration within a range of 10-30 percent. For example, the concentration of the secondary material may be about 20 percent. In another example, the secondary material may have a concentration that is greater than 30 percent. Such concentrations can be selected such that capping layer is sufficiently strengthened to better prevent oxidation and other types of damage.

At some point in the fabrication process that is after the capping layer is exposed, the photoresist layer 108 is removed. The photoresist layer 108 is only in place for the patterning step and is thus no longer needed after the patterning layer 106 has been patterned. In some cases, the photoresist layer 108 is removed after the capping layer has been treated according to principles described herein. The photoresist layer may be removed by wet stripping or plasma ashing.

Figure 1D:
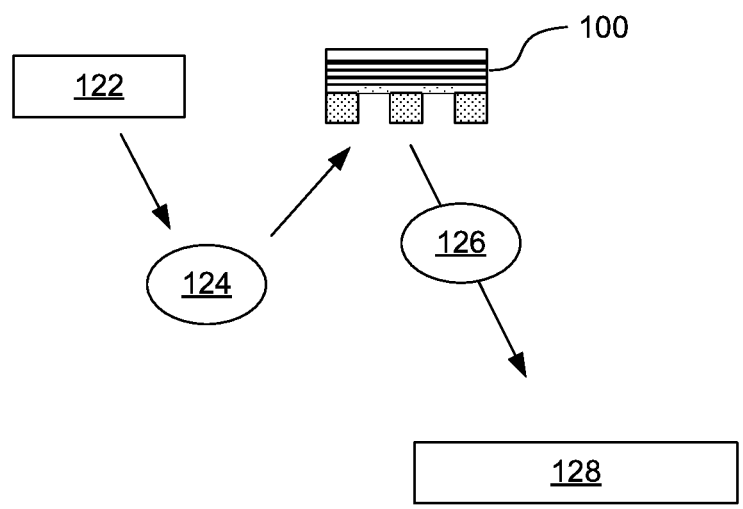

FIG. 1D is a diagram showing an illustrative lithography system 120 that utilizes the mask 100 described in FIGS. 1A-1C. The lithography system 120 includes a radiation source 122, an illuminator 124, the mask 100, and a projection optics box 126. The lithography system 120 is used to expose a pattern on a wafer 128.

The lithography system 120 may also be generically referred to as a scanner that is operable to perform lithography exposing processes with respective radiation source and exposure mode. In the present example, the lithography system 120 is an extreme ultraviolet (EUV) lithography system designed to expose a resist layer on a wafer 128 by EUV light. The resist layer is a material sensitive to the EUV light. The EUV lithography system 120 employs a radiation source 122 to generate EUV light, such as EUV light having a wavelength ranging between about 1 nm and about 100 nm. In one particular example, the radiation source 122 generates an EUV light with a wavelength centered at about 13.5 nm.

The lithography system 120 also employs an illuminator 124. In various examples, the illuminator 124 includes various refractive optic components, such as a single lens or a lens system having multiple lenses (zone plates). Additionally or alternatively, the illuminator includes reflective optics such as a single mirror or a mirror system having multiple mirrors in order to direct light from the radiation source 122 onto a mask stage 100. The mask 100 may be secured on a mask stage 16 (not shown). In some examples, the illuminator 124 is operable to configure the mirrors to provide a proper illumination to the mask 100. In one example, the mirrors of the illuminator 124 are switchable to reflect EUV light to different illumination positions. In some examples, a stage prior to the illuminator 124 may additionally include other switchable mirrors that are controllable to direct the EUV light to different illumination positions with the mirrors of the illuminator 124. In some embodiments, the illuminator 124 is configured to provide an on-axis illumination to the mask 100.

The lithography system 120 also includes a mask stage (not shown) configured to secure the mask 100. In some embodiments, the mask stage includes an electrostatic chuck (e-chuck) to secure the mask 100. This is because gas molecules absorb EUV light, and the lithography system for the EUV lithography patterning is maintained in a vacuum environment to avoid the EUV intensity loss.

The lithography system 120 also includes a projection optics module (or projection optics box (POB) 126 for imaging the pattern of the mask 100 on to a semiconductor substrate such as wafer 128. The POB 126 also includes reflective optics. The light directed from the mask 100, carrying the image of the pattern defined on the mask, is collected by the POB 126. The illuminator 124 and the POB 126 are collectively referred to as an optical module of the lithography system 120. The illuminator and the POB can be adjusted to shrink the pattern of the mask down by a factor of four before the pattern reaches the wafer 128.

Figure 2A:
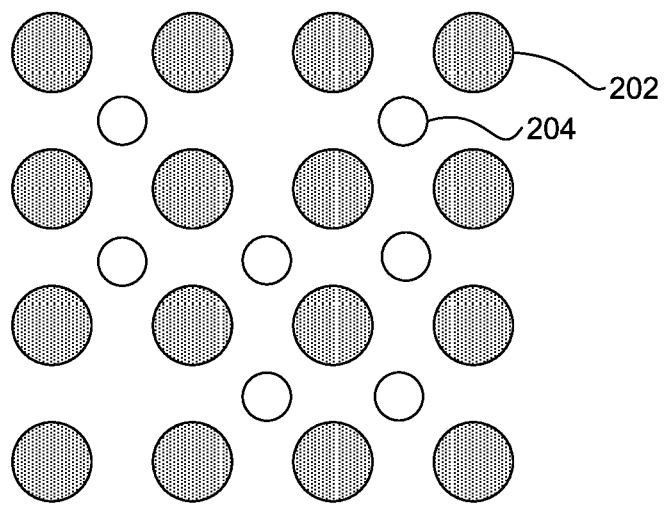
FIGS. 2A-2B are diagrams showing diffusion of a material into a capping layer, according to one example of principles described herein.
Figure 2B:
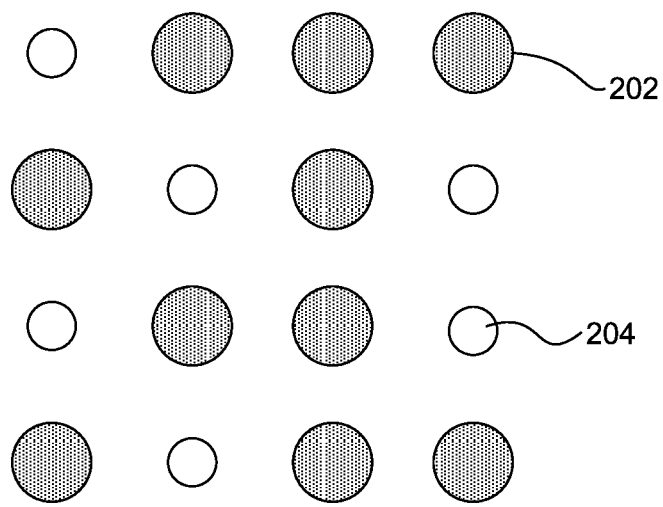

FIGS. 2A-2B are diagrams showing diffusion of a secondary material into a capping layer. According to the present example, FIG. 2A illustrates an example of interstitial diffusion. The larger circles represent the primary capping layer material atoms 202, for example, ruthenium atoms. The smaller circles represent the secondary material atoms 204, which may be for example, nitrogen, carbon, or phosphorous atoms. The ruthenium capping layer forms a crystal structure and thus the atoms 204 are positioned in a periodic pattern.

Interstitial diffusion occurs when the impurity material (i.e., nitrogen) moves and becomes positioned between the locations of atoms of the host material (i.e., ruthenium). In this example, the nitrogen atoms 204 are placed at various locations between the ruthenium atoms 202. The addition of the secondary material produces stress on the capping layer. This stress can provide a stronger capping layer that is less susceptible to oxidation. Particularly, it takes more energy to initiate the chemical reactions that cause oxidation. Thus, the capping layer will last longer during normal use of the mask. To best allow for interstitial diffusion, the atomic number of the secondary material should be smaller than the atomic number of the main material of the capping layer. As described above, in one example, the secondary material is selected from elements having an atomic number less than 15. For example, if the capping layer is made of ruthenium, which has an atomic number of 44, and the secondary material implanted into the ruthenium is nitrogen, which has an atomic number of 7, then the nitrogen atoms are sufficiently smaller than the ruthenium atoms to allow for interstitial diffusion. Furthermore, the nitrogen atoms substantially stay in the interstitial locations.

FIG. 2B is a diagram showing substitution diffusion. Substitution diffusion occurs when impurity atoms replace atoms within the structure of the host material. For example, nitrogen atoms 204 replace the ruthenium atoms 202 within the ruthenium crystal structure. Again, other elements may be used instead of nitrogen, such as carbon, phosphorous, or other element having an atomic number less than 15.

Figure 3A:
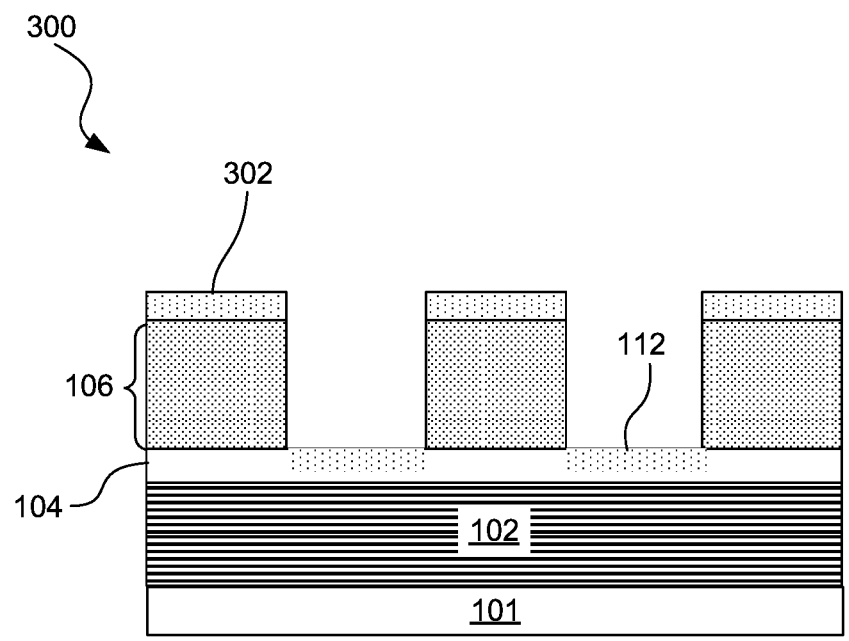
FIG. 3A is a diagram showing an additional capping layer on a patterning layer, according to one example of principles described herein.

FIG. 3A is a diagram showing a mask 300 an additional capping layer 302 on the patterning layer 106. In some examples, an additional capping layer 302 is formed on top of the patterning layer. This may be useful if the patterning layer is a phase shifting layer. Thus, the patterning layer itself is similar to the reflective multilayer 102. Accordingly, it is desirable to protect such a material with a capping layer 302. The treatment process used to treat the exposed portion of the capping layer 104 can also be used to treat the capping layer 302 formed on the patterning layer 106. Thus, the capping layer 302 will be similar to the strengthened portions 112 of the underlying capping layer 104. The capping layer 302 will thus also be more resistant to oxidation and other damage.

Figure 3B:
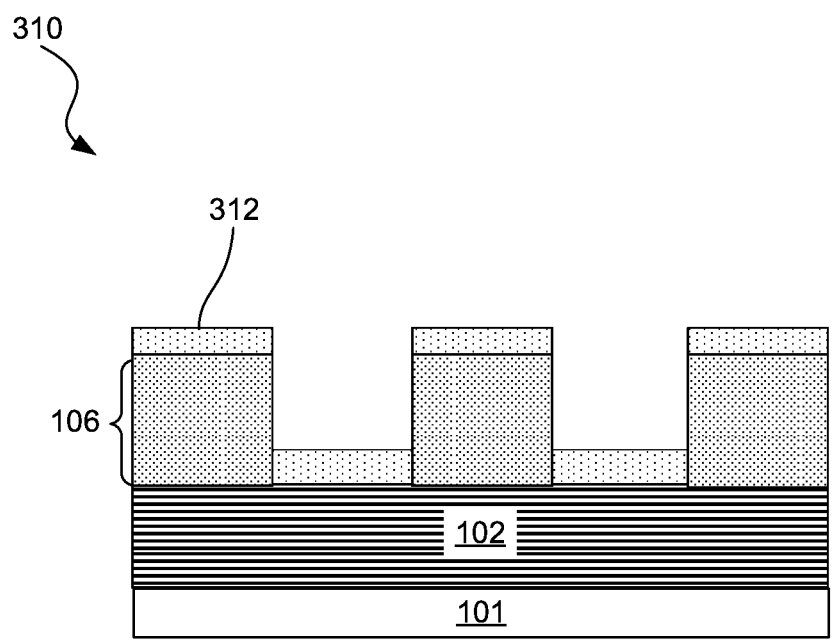
FIG. 3B is a diagram showing a capping layer formed after the patterning layer, according to one example of principles described herein.

FIG. 3B is a diagram showing a mask 310 with the capping layer 312 formed after the patterning layer. Thus, the capping layer is disposed on top of the features of the patterned patterning layer 106 and on the exposed portions of the reflective multilayer 102. The capping layer 312 can then be treated as described above. Particularly, a secondary material is introduced into the capping layer to strengthen the capping layer. The strengthened capping layer 312 is thus less prone to oxidation and other forms of damage.

Figure 4:
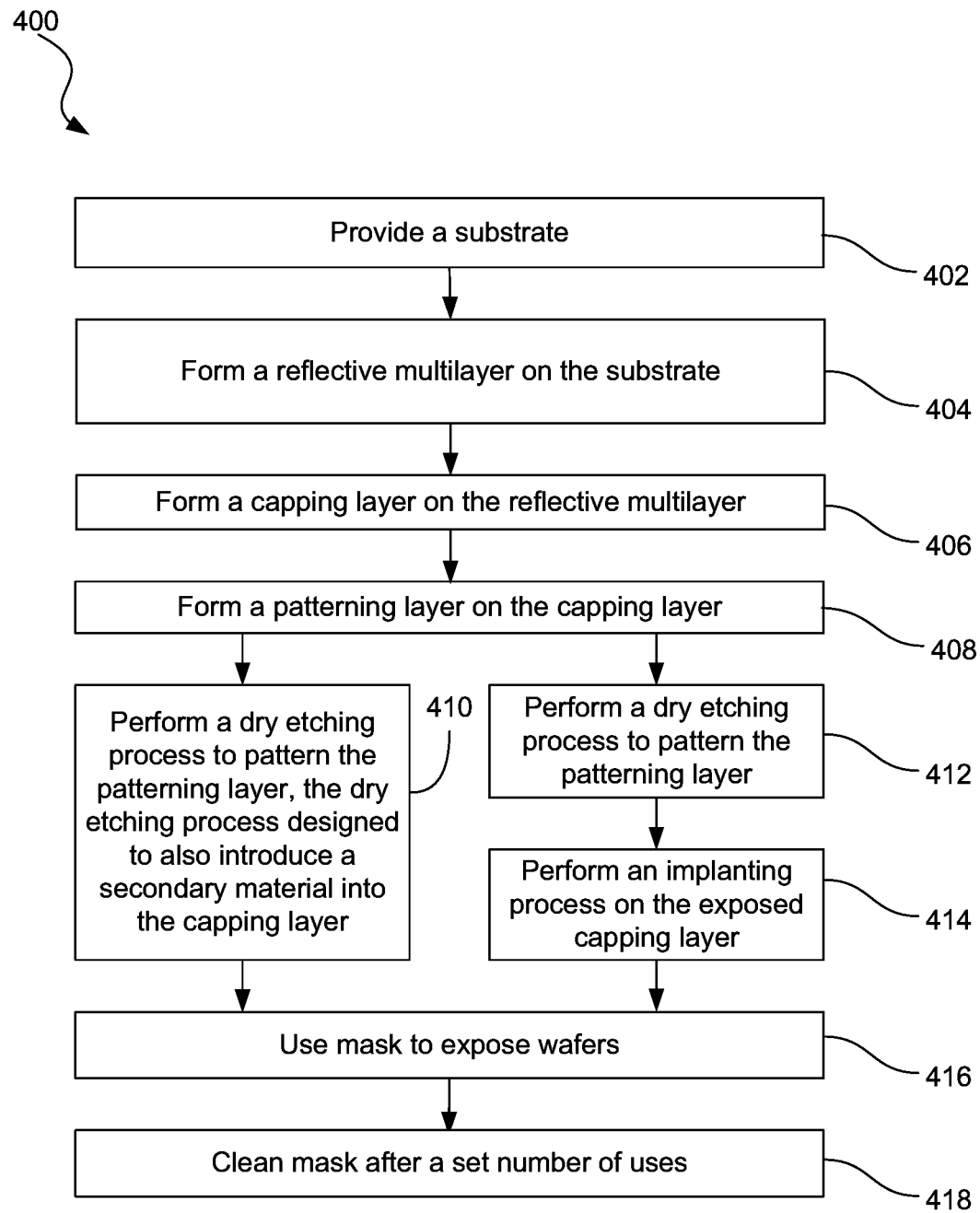
FIG. 4 is a flowchart showing an illustrative method for treating a capping layer of a mask, according to one example of principles described herein.

FIG. 4 is a flowchart showing an illustrative method for forming a mask. According to the present example, the method 400 includes a step 402 for providing a mask substrate. The mask substrate is formed of a LTEM material so that the mask will be less prone to warping during normal use of the mask.

The method 400 includes a step 404 for forming a reflective multilayer on the substrate. As described above, the reflective multilayer 102 includes a plurality of film pairs, such as molybdenum-silicon (Mo/Si) film pairs or molybdenum-beryllium (Mo/Be) film pairs. The characteristics of the reflective multilayer 102 are selected such that it provides a high reflectivity to specific electromagnetic radiation type/wavelength. Specifically, for the purpose of EUV lithography, the reflective multilayer 102 is designed to reflect light within the EUV range. The formation of the reflective multilayer may include chemical vapor deposition (CVD), physical vapor deposition (PVD), atomic layer deposition (ALD) or other suitable technique.

The method 400 further includes a step 406 for forming a capping layer on the reflective multilayer. The capping layer is designed to protect the reflective multilayer. The capping layer has a thickness within a range of 2-4 nanometers. The capping layer can be made of ruthenium. The formation of the capping layer may include CVD, PVD, ALD or other suitable technique.

The method 400 includes a step 408 for forming a patterning layer on the capping layer. The patterning layer may be an absorptive layer in the example where the mask is a binary intensity mask. The patterning layer may also be a phase shifting layer in the example where the mask is a phase shifting mask.

The method 400 includes two different options for treating the capping layer. In the first option, at step 410, a dry etching process is performed to pattern the patterning layer. The dry etching process is designed to also introduce a secondary material into the capping layer. For example, if nitrogen is to be introduced into the capping layer, then the gases used for the dry etch process include nitrogen. For example, the gases may be a chorine and nitrogen mix. Thus, the dry etching process will proceed to remove the patterning layer. Upon reaching the capping layer, the dry etching process will begin to introduce the nitrogen into the exposed capping layer.

For the second option, at step 412, a dry etching process is performed to pattern the patterning layer. Then, after the patterning process is complete, a separate step, step 414, is used to perform an implanting process to implant the secondary material into the exposed portions of the capping layer. The implanting step, step 414, can be performed in the same chamber in which the patterning step, step 412, is performed.

The method 400 may further include a step 416 for using the mask to expose wafers. As described above, an EUV lithography process involves projecting EUV light onto the mask. The EUV light is then reflected off the EUV mask and on to a wafer to form a pattern on that wafer. The pattern is used to form part of an integrated circuit on the wafer.

The method 400 further includes a step 418 for cleaning the mask after a set number of uses. The EUV process often causes particles to accumulate on the mask. Such particles can reduce the effectiveness of the mask. Thus, the mask may be cleaned at certain intervals, such as after every 40 uses. The mask may be cleaned by being immersed in a cleaning fluid. In some examples, the cleaning process may also cause some damage to the capping layer. But, by using principles described herein, the capping layer of the mask is strengthened and is thus less prone to damage that can be caused by normal use of the mask, cleaning the mask, and oxidation of the mask.

According to one illustrative example, a method for forming a lithography mask includes forming a capping layer on a reflective multilayer layer, the capping layer comprising a first material, forming a patterned patterning layer on the capping layer, and introducing a secondary material into the capping layer, the secondary material having an atomic number that is smaller than 15.

According to one example, a method for fabricating a lithography mask includes providing a substrate, forming a reflective multilayer on the substrate, forming a capping layer on the reflective multilayer, the capping layer comprising a first material, forming a patterning layer on the capping layer, patterning the patterning layer to expose portions of the capping layer, introducing a second material into the capping layer, the second material having an atomic number small enough to allow for interstitial diffusion of the second material into the first material.

According to one example, a lithography mask includes a reflective multilayer, a capping layer formed on the reflective layer, the capping layer comprising ruthenium and a second material, the second material having an atomic number less than 15 and being dispersed in interstitial positions of the capping layer, and a patterning layer on the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a lithography mask, the method comprising:
    forming a capping layer on a reflective multilayer layer, the capping layer comprising a first material; and
    introducing a secondary material into the capping layer, the secondary material having an atomic number that is smaller than 15.

2. The method of claim 1, wherein the first material comprises ruthenium.

3. The method of claim 1, wherein the secondary material comprises at least one of: nitrogen, carbon, or phosphorous.

4. The method of claim 1, further comprising, forming a patterned patterning layer on the capping layer to expose portions of the capping layer by a dry etching process.

5. The method of claim 4, wherein the patterned patterning layer is one of: a phase shifting layer or an absorption layer.

6. The method of claim 4, wherein the introducing is done to the exposed portions of the capping layer while performing the dry etching process to pattern the patterning layer.

7. The method of claim 6, wherein a gas of the dry etching process comprises a mix of chlorine and a gas containing the secondary material.

8. The method of claim 4, wherein the introducing includes performing an ion implantation using a gas containing the secondary material in a same chamber as the dry etching process used to form the patterned patterning layer.

9. The method of claim 1, wherein the introducing is performed at room temperature.

10. The method of claim 1, wherein a concentration of the secondary material is about 20 percent.

11. The method of claim 1, wherein introducing the secondary material into the capping layer causes the secondary material to be interstitially diffused into the first material.

12. The method of claim 1, wherein the secondary material is diffused into the first material through substitution diffusion.

13. A method for fabricating a lithography mask, the method comprising:
    providing a substrate;
    forming a reflective multilayer on the substrate;
    forming a capping layer on the reflective multilayer, the capping layer comprising a first material; and
    introducing a second material into the capping layer, the second material having an atomic number small enough to allow for interstitial diffusion of the second material into the first material.

14. The method of claim 13, wherein the capping layer comprises ruthenium in a crystal structure.

15. The method of claim 13, wherein the second material is implanted to a depth that is less than a point in the capping layer where the capping layer diffuses with the reflective multilayer.

16. The method of claim 13, wherein a concentration of the second material within the first material is greater than 30 percent.

17. The method of claim 13, further comprising,
    forming a patterned patterning layer on the capping layer; and
    forming an additional capping layer on the patterned patterning layer.

18. A lithography mask comprising:
    a reflective multilayer; and
    a capping layer formed on the reflective multilayer, the capping layer comprising ruthenium and a second material, the second material having an atomic number less than 15 and being dispersed in interstitial positions of the capping layer.

19. The lithography mask of claim 18, wherein the second material has a concentration ranging between about 10 percent and about 30 percent.

20. The lithography mask of claim 18, further comprising a patterned patterning layer disposed on the capping layer, the patterned patterning layer exposing portions of the capping layer that comprises the ruthenium and the second material, wherein the patterned patterning layer includes at its top surface another reflective multilayer.

* * * * *